(12) United States Patent
Volkovich et al.

(10) Patent No.: US 10,962,951 B2
(45) Date of Patent: Mar. 30, 2021

(54) PROCESS AND METROLOGY CONTROL, PROCESS INDICATORS AND ROOT CAUSE ANALYSIS TOOLS BASED ON LANDSCAPE INFORMATION

(71) Applicant: KLA-TENCOR CORPORATION, Milpitas, CA (US)

(72) Inventors: Roie Volkovich, Hadera (IL); Yaniv Abramovitz, Mazkeret Batya (IL)

(73) Assignee: KLA-Tencor Corporation, Milpitas, CA (US)

( * ) Notice: Subject to any disclaimer, the term of this patent is extended or adjusted under 35 U.S.C. 154(b) by 160 days.

(21) Appl. No.: 16/013,344

(22) Filed: Jun. 20, 2018

(65) Prior Publication Data

US 2019/0391557 A1 Dec. 26, 2019

(51) Int. Cl.
*G05B 19/401* (2006.01)

(52) U.S. Cl.
CPC .. *G05B 19/401* (2013.01); *G05B 2219/45031* (2013.01)

(58) Field of Classification Search
CPC ............... G05B 19/401; G05B 2219/45031
See application file for complete search history.

(56) References Cited

U.S. PATENT DOCUMENTS

| | | | |
|---|---|---|---|
| 7,463,939 B1 * | 12/2008 | Mata ............... | G06Q 10/10 700/100 |
| 7,547,560 B2 | 6/2009 | Patterson et al. | |
| 2004/0070772 A1 * | 4/2004 | Shchegrov ........... | G01N 21/211 356/625 |
| 2004/0110310 A1 * | 6/2004 | Sun .................... | G03F 7/70533 438/5 |
| 2005/0132306 A1 * | 6/2005 | Smith ................. | G06F 17/5068 716/114 |
| 2007/0050749 A1 * | 3/2007 | Ye ...................... | G03F 1/44 430/30 |

(Continued)

FOREIGN PATENT DOCUMENTS

| JP | 2008514015 A | 5/2008 |
|---|---|---|
| WO | 2014074893 A1 | 5/2014 |
| WO | 2016086056 A1 | 6/2016 |

OTHER PUBLICATIONS

WIPO, ISR for PCT/US2019/036868, dated Oct. 4, 2019.

*Primary Examiner* — Thomas C Lee
*Assistant Examiner* — Charles Cai
(74) *Attorney, Agent, or Firm* — Hodgson Russ LLP

(57) ABSTRACT

Methods and metrology modules are provided, which derive landscape information (expressing relation(s) between metrology metric(s) and measurement parameters) from produced wafers, identifying therein indications for production process changes, and modify production process parameters with respect to the identified indications, to maintain the production process within specified requirements. Process changes may be detected in wafer(s), wafer lot(s) and batches, and the information may be used to detect root causes for the changes with respect to production tools and steps and to indicate tool aging and required maintenance. The information and its analysis may further be used to optimize the working point parameters, to optimizing designs of devices and/or targets and/or to train corresponding algorithms to perform the identifying, e.g., using training wafers.

13 Claims, 8 Drawing Sheets

(56) References Cited

U.S. PATENT DOCUMENTS

| | | |
|---|---|---|
| 2013/0288403 A1* | 10/2013 | Chen .................. H01L 22/20 |
| | | 438/16 |
| 2014/0114611 A1* | 4/2014 | Moyne ................ G05B 23/024 |
| | | 702/183 |
| 2015/0323316 A1* | 11/2015 | Shchegrov ......... G01N 21/9501 |
| | | 702/150 |
| 2016/0313658 A1 | 10/2016 | Marciano et al. |
| 2018/0023950 A1 | 1/2018 | Marciano et al. |
| 2018/0047646 A1 | 2/2018 | Bringoltz et al. |
| 2019/0088514 A1 | 3/2019 | Volkovich et al. |
| 2019/0137892 A1* | 5/2019 | Cekli .................. H01L 22/12 |

* cited by examiner

PROCESS AND METROLOGY CONTROL, PROCESS INDICATORS AND ROOT CAUSE ANALYSIS TOOLS BASED ON LANDSCAPE INFORMATION

TECHNICAL FIELD

The present invention relates to the field of metrology, and more particularly, to the usage of landscape information for process control.

BACKGROUND OF THE INVENTION

Metrology measurements are used to provide indication concerning the process adequacy and are carried out according to measurement recipes, which are optimized with relation to setup and measurement parameters.

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a method comprising: deriving landscape information from produced wafers, identifying, in the derived landscape information, indications for production process changes, and modifying production process parameters with respect to the identified indications, to maintain the production process within specified requirements, wherein the landscape information comprises a relation between at least one metrology metric and at least one recipe or measurement parameter, and wherein at least one of the deriving, the identifying and the modifying is carried out by at least one computer processor.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
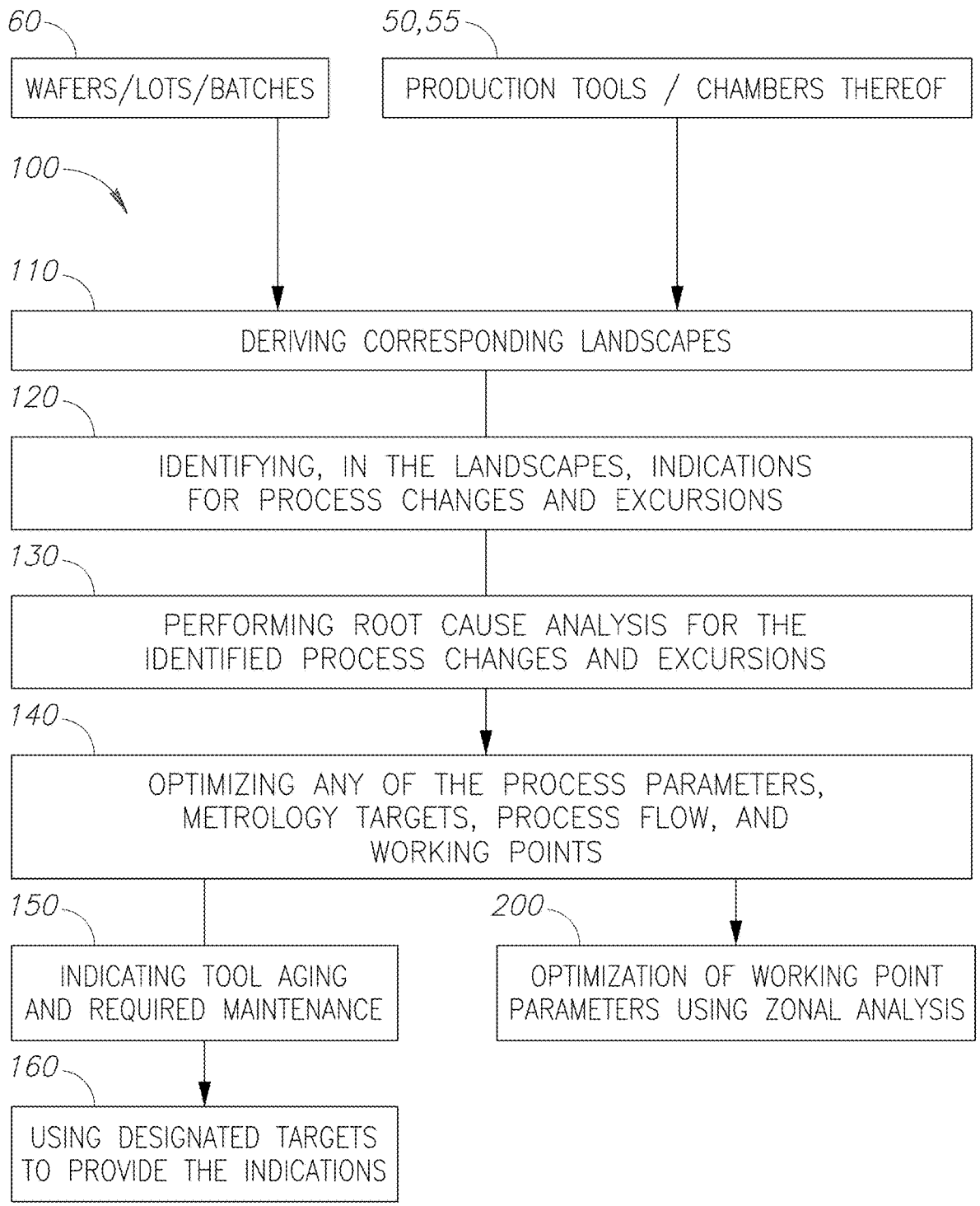
FIG. 1 is a high-level flowchart illustrating a method, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing", "deriving" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices. In certain embodiments, illumination technology may comprise, electromagnetic radiation in the visual range, ultraviolet or even shorter wave radiation such as x rays, and possibly even particle beams.

Methods and metrology modules are provided, which derive landscape information (expressing relation(s)

between metrology metric(s) and measurement parameters) from produced wafers, identifying therein indications for production process changes, and modify production process parameters with respect to the identified indications, to maintain the production process within specified requirements. Process changes may be detected in wafer(s), wafer lot(s) and batches, and the information may be used to detect root causes for the changes with respect to production tools and steps and to indicate tool aging and required maintenance. The information and its analysis may further be used to optimize the working point parameters, to optimizing designs of devices and/or targets and/or to train corresponding algorithms to perform the identifying, e.g., using training wafers. Certain embodiments comprise using the information to apply root cause analysis to the production flow and/or zonal analysis to wafers, e.g., using wavelength spectra signatures over the wafers.

Embodiments of the present invention provide efficient and economical methods for improving semiconductor production processes and thereby provide improvements to the technological field of semiconductor metrology. Advantageously, while current practices utilize metrology flags to provide indicators for process change, disclosed embodiments use the metrology tool landscape information as part of a control loop for a process and/or metrology tools as well and further provide root cause analysis for the source of process tool and/or parameter changes. Any metrology tool may be used to derive the landscape information, such as, e.g., imaging metrology tools, scatterometry metrology tools, SEM (scanning electron microscopy), e-beam technologies, or any other metrology technology.

FIG. 1 is a high-level flowchart illustrating a method 100, according to some embodiments of the invention. The method stages may be carried out with respect to various metrology tools 80, which may optionally be configured to implement method 100. Method 100 may be at least partially implemented by at least one computer processor, e.g., in a metrology module 90 (see e.g., FIGS. 6A and 6B below). Certain embodiments comprise computer program products comprising a computer readable storage medium having computer readable program embodied therewith and configured to carry out the relevant stages of method 100. Method 100 may comprise the following stages, irrespective of their order.

Method 100 may comprise deriving—using one or more metrology tool(s) 80 and with respect to a plurality of produced wafers, lots and/or batches 60, and corresponding production tool(s) 50 and/or chambers 55 thereof—landscapes (or landscape information) that correspond to combinations thereof (stage 110), identifying, in the landscapes (or landscape information), indications for production process changes and excursions (stage 120), performing root cause analysis for the identified process changes and excursions (stage 130), optionally using training data to develop algorithms that relate wafer map characteristics to process change parameters (stage 135) and optimizing any of the process parameters, metrology targets, process flow, and working points (stage 140)—as explained in further details below. For example, optimizing 140 may comprise modifying production process parameters with respect to the identified indications, to maintain the production process within specified requirements the landscape information may comprise a relation between at least one metrology metric and at least one recipe or measurement parameter (and see below), and at least one of deriving 110, identifying 120 and optimizing and/or modifying 140 may be carried out by at least one computer processor Method 100 may further comprise indicating tool aging and required maintenance (stage 150) and possibly using designated targets to provide the indications (stage 160). Method 100 may further comprise optimizing devices and/or targets designs with respect to the wafer maps.

In certain embodiments, method 100 may further comprise optimization of working point parameters using zonal analysis (stage 200), as presented in FIGS. 6A, 6B below and in U.S. patent application Ser. No. 15/751,514, incorporated herein by reference in its entirety.

Landscapes refer to dependency(ies) of one or more metrology metric(s) on one or more recipe and/or measurement parameter, as disclosed, e.g., in U.S. Patent Publication No. 20160313658 and in WIPO Publication No. 2016086056, which are incorporated herein by reference in their entirety. A non-limiting example used throughout the description is of using the tunable wavelength as measurement parameter, with respect to which the landscapes are derived. Using the wavelength is merely a non-limiting example, which may be replaced by any other metrology parameter. The landscapes or signatures are understood as a way to visualize the dependency of the metrology metric(s) on the parameter(s) and are not limited to continuous dependencies, to analytical dependencies (expressible as functions) nor to specific ways by which the dependency is derived (e.g., experimentally, by simulation or analytically). It is noted that any of the parameters may be understood to have discrete values or continuous values, depending on specific measurement settings. In certain embodiments, landscapes comprise an at least partially continuous dependency, or a densely sampled dependency, of at least one metrology metric on at least one recipe parameter. For convenience of explanation, landscapes and landscape information are illustrated herein as landscape plots 112 and wafer maps 115 of position-associated landscapes 112, yet it is emphasized that landscapes, landscape information or landscape signatures may be derived used in different ways, possibly ways which are not plotted and/or not based on wafer location. Landscape information may be used in any of the following ways, and the disclosure is not limited to wafer map representations, which are merely used for convenience.

For example, metrology tools that use wavelength tunability capability (as a non-limiting example) can create landscape information per site with respect to the wavelength. Landscape plots 112 may be generated from tool measurements information and/or metrology metrics such as overlay, residuals, accuracy flags, intensity, reflection, sensitivity, and other measurements information, and may be generated with respect to various measurement parameter(s), such as wavelength, illustrated in a schematic example in FIG. 2.

Figure 2:
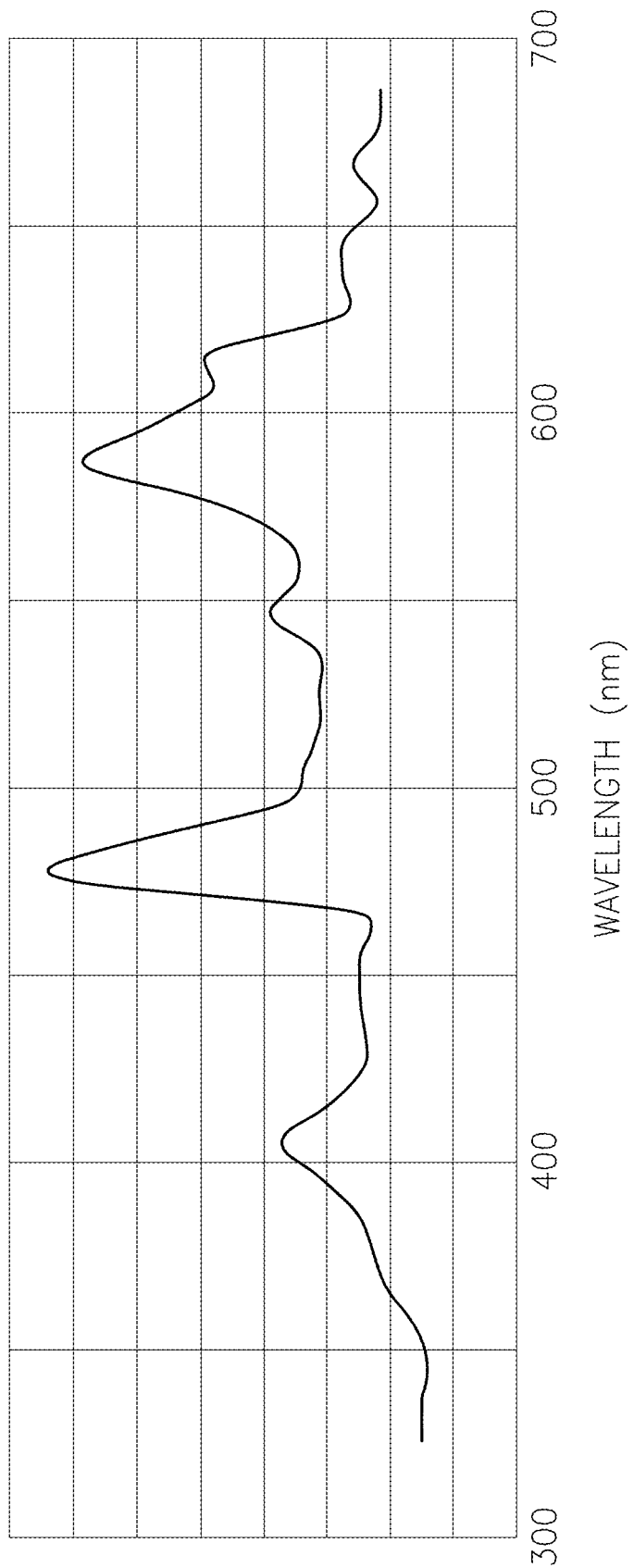
FIG. 2 is a high-level schematic illustration of a landscape (or landscape signature), according to some embodiments of the invention.

FIG. 2 is a high-level schematic illustration of a landscape (or landscape signature) 112, according to some embodiments of the invention. In the illustrated non-limiting example, landscape 112 is generated from tunable metrology tool 80. In various embodiments, landscapes 112 may be derived using a range of metrology technologies and corresponding metrology targets such as imaging, scatterometry, using e-beam radiation (and/or x-rays, particle beams, etc.), or any other metrology technology (stage 110).

In certain embodiments, landscapes 112 and plots thereof may be used as indicator(s) (or for deriving indicators) for process change and excursions within wafer, lot to lot, batch to batch 60, e.g., in HVM (High Volume Manufacturing), pilot and/or in R&D (research and development) environment (stage 120).

In certain embodiments, landscapes 112 and plots thereof may be used to provide root cause analysis for process change and excursions within wafer, lot to lot, batch to batch 60, and among different process tools 50, different products, deferent metrology targets and device architectures, in HVM, pilot and/or in R&D environment (stage 130).

In certain embodiments, landscapes 112 and plots thereof may be used to optimize the process parameters, metrology targets, process flow, and working point relating to the metrology procedures (stage 200, and see below and in U.S. patent application Ser. No. 15/751,514, incorporated herein by reference in its entirety).

In certain embodiments, landscapes 112 and plots thereof may be used as indicator(s) (or for deriving indicators) for aging of performing tools and for required PM (planned maintenance) for metrology, process and/or lithography tools 80, 50 (stage 150).

Figure 3:
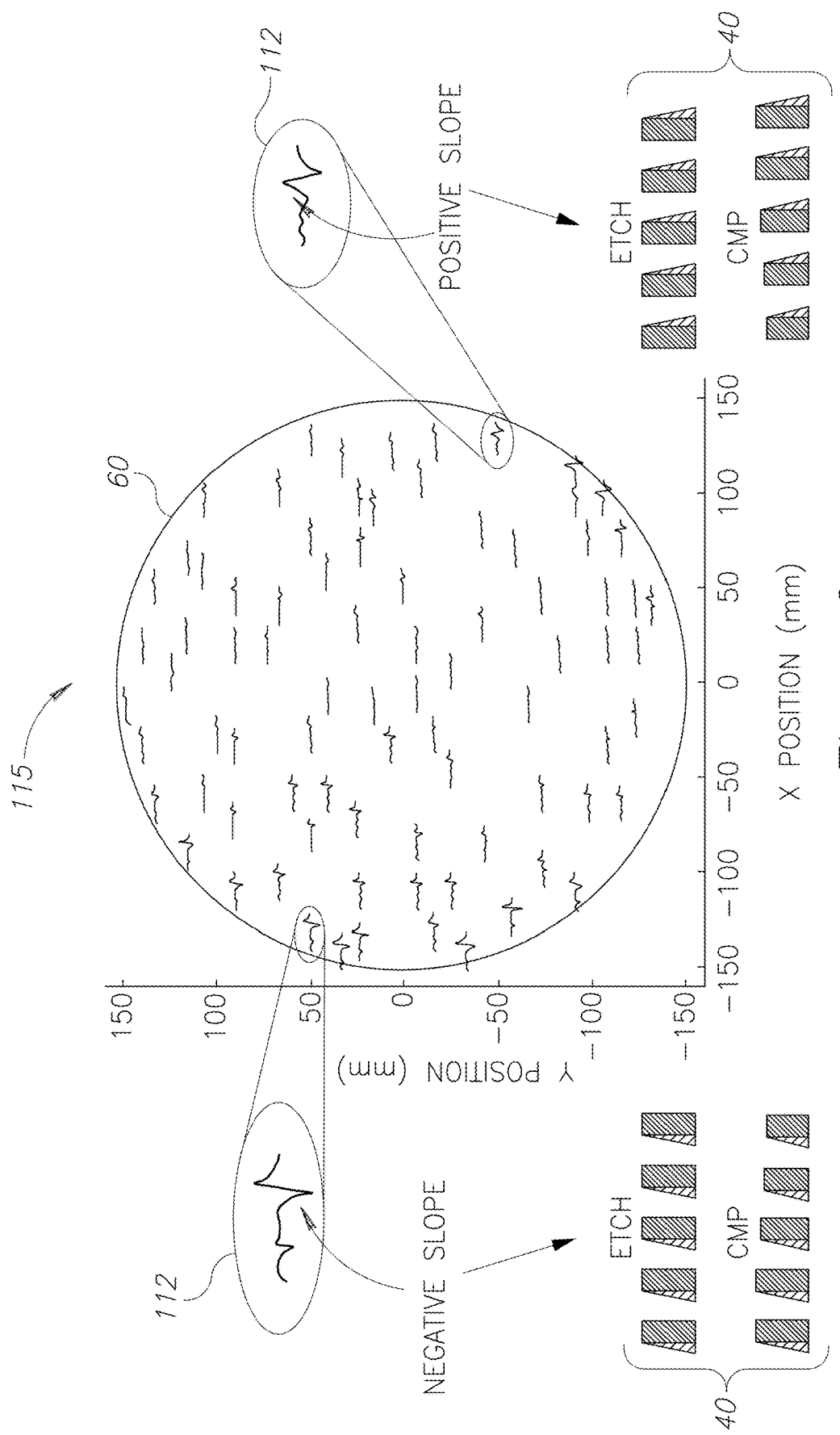
FIG. 3 is a high-level schematic illustration of an example for a wafer map constructed from landscape plots and related to process characteristics, according to some embodiments of the invention.

FIG. 3 is a high-level schematic illustration of an example for a wafer map 115 constructed from landscape plots 112 and related to process characteristics, according to some embodiments of the invention. Wafer map 115 indicates landscape signatures 112 with relation to the spatial relations on wafer 60 of the measured targets (with respect to which landscapes 112 are measured). In this non-limiting example, negative and positive slopes in landscape 112 are related to, and indicate, asymmetric process aberrations 40, such as side wall angles (SWA) produced in etch and/or CMP (chemical mechanical processing) steps. The shifts and changes in landscapes 112 may be used to indicate, or to derive indicators for process changes 40, such as the illustrated asymmetric process variations (photo resist SWA change) (see e.g., stage 120). Landscape plots 112 may be measured per site and be presented as wafer map or field map 115. Wafer map 115, based on landscapes 112, may be used to provide indicators for process changes 40 like (and not limited to) shape or shift through the field or wafer and/or parameters of process changes 40 such as magnitude, slope etc. It is emphasized that indicated changes by wafer map 115 may be symmetric (e.g., thickness change) or asymmetric (e.g., photo resist SWA change), and disclosed embodiments may be configured to indicate any symmetric and/or asymmetric process changes and to distinguish among them.

Figure 4:
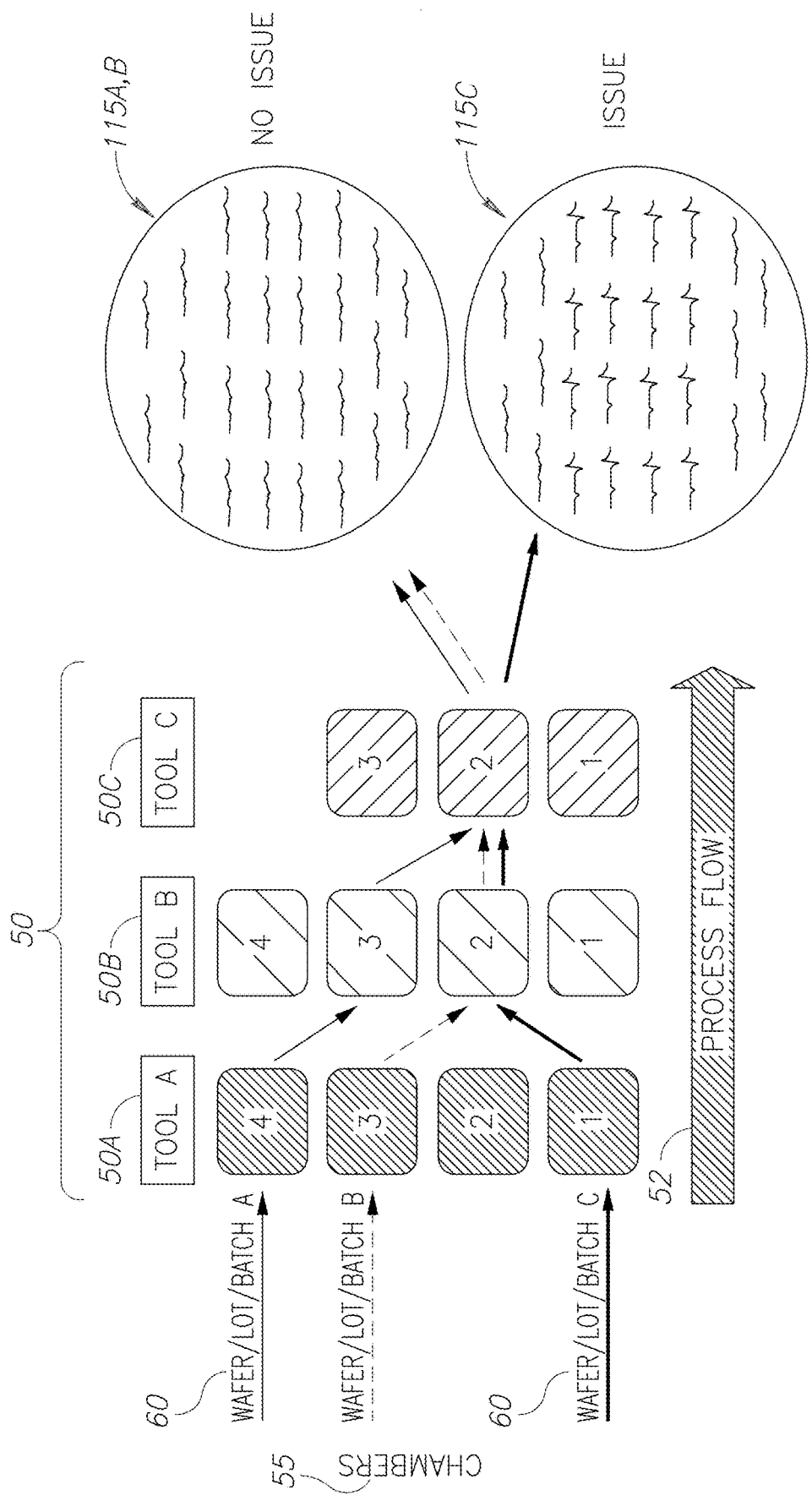
FIG. 4 is a high-level schematic illustration of an example for using wafer maps constructed from landscape plots and related to process characteristics—to perform root cause analysis with respect to multiple production tools and chambers thereof, according to some embodiments of the invention.

FIG. 4 is a high-level schematic illustration of an example for using wafer maps 115 constructed from landscape plots 112 and related to process characteristics—to perform root cause analysis (see e.g., stage 130) with respect to multiple production tools 50 and chambers thereof 55, according to some embodiments of the invention. In certain embodiments, wafer maps 115 may be used to identify, monitor and/or control tool(s) 50 and/or chamber(s) 55 thereof, and detected problematic issues related to them, based on analysis of related landscapes 112 in wafer map 60. In the illustrated, non-limiting example, three tools 50A, 50B, 50C are illustrated, having multiple chambers 55 each, configured to produce multiple wafers, wafer lots and/or batches thereof 60. Three schematic examples, denoted by "A", "B" and "C", are illustrated going through the production process in corresponding tools 50 and chambers 55 (denoted as process flow 52) and resulting in different, corresponding, wafer maps 115A, 115B, 115C, the former two indicating regular production (indicated by the label "no issue") and latter indicating process changes which exceed specified criteria (indicated by the label "issue" for wafer map 115C). The root cause analysis based on wafer maps 115 may be used to find the causes of process changes and/or excursions, e.g., relate specific process changes to specific tool(s) 50 and/or chamber(s) 55. For example, the landscape plots per site may be correlated with process tools measurements and/or parameters, indicating the source of error, and may also be used to quantify the amount of process change using advanced algorithms such as algorithms based on machine learning and other algorithms. Wafer maps 115 with landscape information on reference wafers with known DOE (design-of-experiment, e.g., thickness change, induced overlay, geometry change, etc.) may be used as training data for such algorithms that are implemented on the wafers with process change, and the process change values (for example, thickness) may be calculated therefrom. For example, a corresponding algorithm can be trained to perform identifying 110, using training wafers to which method 100 is applied.

In various embodiments, wafer maps 115 may be used to optimize process parameters such etch time, CMP parameters, etc., and to optimize the working point per each process tool including metrology tool (e.g., see stage 140). Moreover, zonal analysis may be performed to provide additional characterization of the process errors (see FIGS. 6A and 6B below and in U.S. patent application Ser. No. 15/751,514, incorporated herein by reference in its entirety).

In certain embodiments, the wafer maps information including landscape signatures 112 per wafer site may be used to provide indicator(s) which related to performance change of various tools 50, 80, e.g., for metrology tools 80, process tools, lithography tools 50 etc. (e.g., see stage 150). For example, the landscape signatures at the field level (112) and at the wafer level (115) may be used for tracking the performance degradation of the tools and help optimize the schedule tool maintenance or any other related activity. Customers may also use these to improve device design or metrology targets, as disclosed below.

Figure 5:
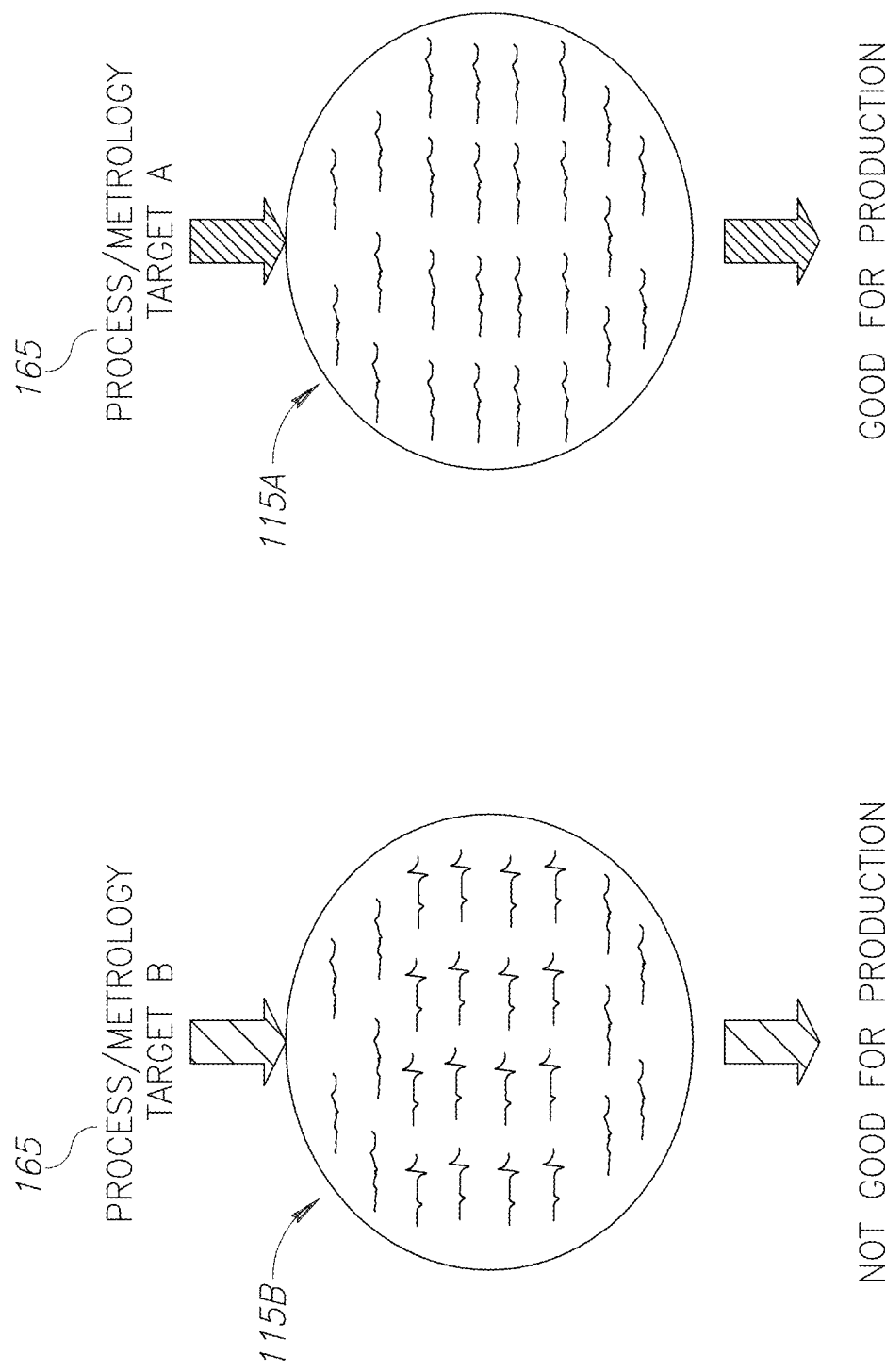
FIG. 5 is a high-level schematic illustration of an example for using wafer maps constructed from landscape plots to optimize device and/or target design, according to some embodiments of the invention.

FIG. 5 is a high-level schematic illustration of an example for using wafer maps 115 constructed from landscape plots 112 to optimize device and/or target design, according to some embodiments of the invention. FIG. 5 illustrates schematically wafer maps 115A, 115B which correspond to two device or target designs 165, and indicate their adequacy for production at given settings (denoted "good for production" and "not good for production", respectively). In certain embodiments, wafer maps 115 which are based on landscapes 112 may be used to identify which process and which metrology target design are better to use to improve various parameters, such as any of accuracy, robustness, yield, reliability and improved control.

Figure 6A:
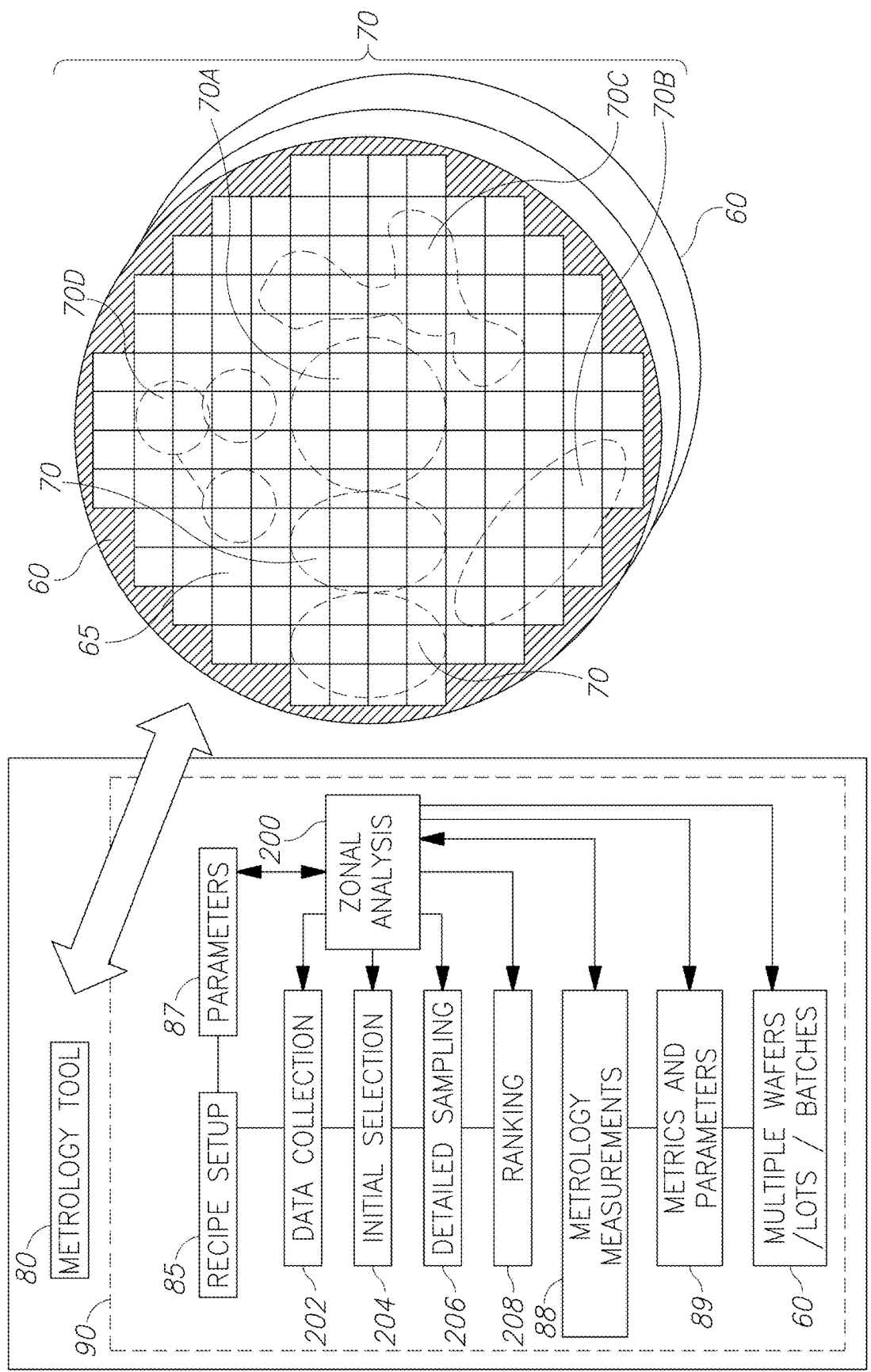
FIG. 6A is a high-level schematic illustration of a metrology tool having a metrology module configured to carry out zonal analysis with respect to various zones on wafer(s)—during any of a variety of recipe setup and/or measurement steps, according to some embodiments of the invention.

FIG. 6A is a high-level schematic illustration of a metrology tool 80 having a metrology module 90 configured to carry out zonal analysis 200 with respect to various zones 70 on wafer(s) 60—during any of a variety of recipe setup and/or measurement steps, as disclosed in the following, according to some embodiments of the invention.

FIG. 6A illustrates schematically various types of zones 70, such as a central zone 70A, a marginal zone 70B, an intermediate, possibly partly convex zone 70C, interconnected sub-zones (cluster) 70D, etc., any of which may be identified and utilized in zone analysis 200 disclosed below. Zones 70 may be defined as a number of dies 65 and/or as continuous or semi-continuous regions on wafer 60.

Metrology module 90 may be configured to implement zonal analysis 200 during various stages of recipe setup 85, such as any of data collection phase 202, initial selection phase 204, detailed sampling phase 206, ranking phase 208 and with respect to one or more parameter 87—as explained in U.S. patent application Ser. No. 15/751,514 in detail, and/or implement zonal analysis 200 during various stages of carrying out metrology measurements 88 and with respect to metric(s) and/or parameter(s) 89 of the measurements and/or with respect to multiple wafers 60, lots and batches, as disclosed below.

Certain embodiments comprise implementing zonal analysis 200 during production (in metrology measurements 88) and not only for recipe selection 85. The tool parameters may be collected in parallel to production flow and zonal analysis 200 may be implemented with respect to various metric and parameters to optimize metrology measurements 89 and/or as a defense system for detecting, monitoring and correcting for process variation and process excursions, and advantageously capture process variation changes and excursions earlier and more accurately than prior art methods.

Various embodiments comprise implementing zonal analysis 200 as disclosed herein in either or both standalone and integrated metrology tools 80 applying imaging and/or scatterometry metrology methodologies, or any other metrology technology.

Figure 6B:
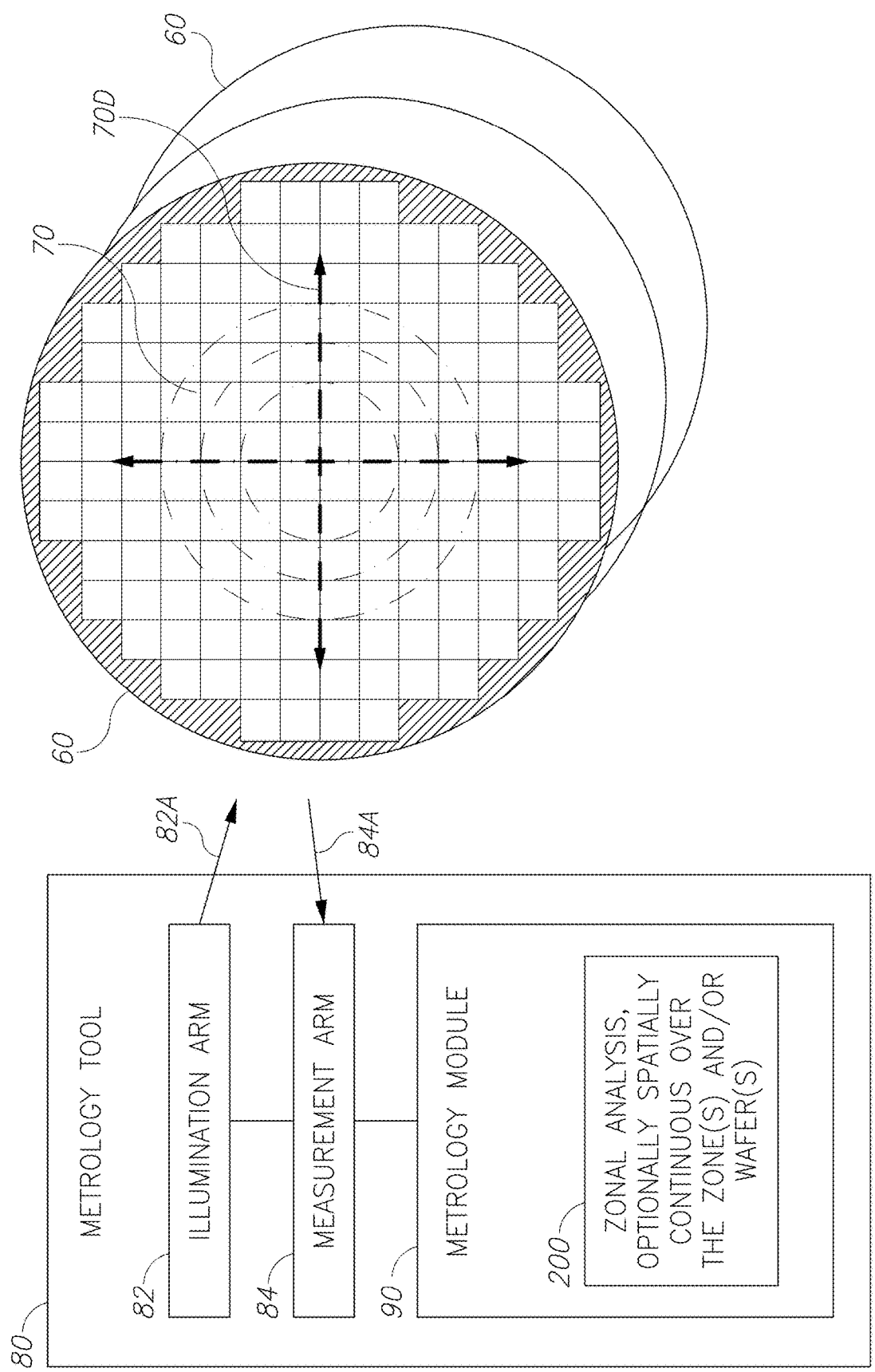
FIG. 6B is a high-level schematic illustration of a metrology tool with a metrology module configured to operate with tunable spectrum, according to some embodiments of the invention.

FIG. 6B is a high-level schematic illustration of metrology tool 80 with metrology module 90 configured to operate with tunable spectrum, according to some embodiments of the invention. Metrology tool 80 may comprise an illumination arm 82 providing illumination radiation 82A which may be tunable in tis wavelength (tunable spectrum illumination). Metrology tool 80 further comprises measurement arm 84 receiving radiation 84A (e.g., image signals at the field plane of imaging tool 80 and/or diffraction signals at the pupil plane of scatterometry tool 80) and delivering the signals to metrology module 90 for analysis. Metrology module 100 may implement zonal analysis 200 as disclosed herein, according to zones 70 and/or at least partly spatially continuously (indicated schematically by arrows 70D) over zones 70 and/or wafers 60.

In metrology tools 80 with tunable spectrum in illumination arm 82, the difference between the measurement conditions of the different zones may be infinitesimal. The dependency of the optimal spectrum parameters (e.g., wavelength, bandwidth, power) may be determined as a continuous function (illustrated schematically by arrows 70D) of the wafer position and/or field position. In certain embodiments, the measurement conditions may be optimized at different positions, possibly spatially continuously, as least in one or some of zones 70.

In certain embodiments, one or more process-related parameters which have known correlation(s) to the optimal measurement conditions may be measured, for example— layer or element thickness, critical dimension (CD) and/or the light phase difference. The e measured parameter(s) may be directly measured and/or derived from another inspection tool or monitoring measurements (e.g., electrical tests, yield analysis). Zonal analysis 200 may be carried out, possibly at least partly spatially continuously, with respect to the one or more process-related parameters.

Figure 7:
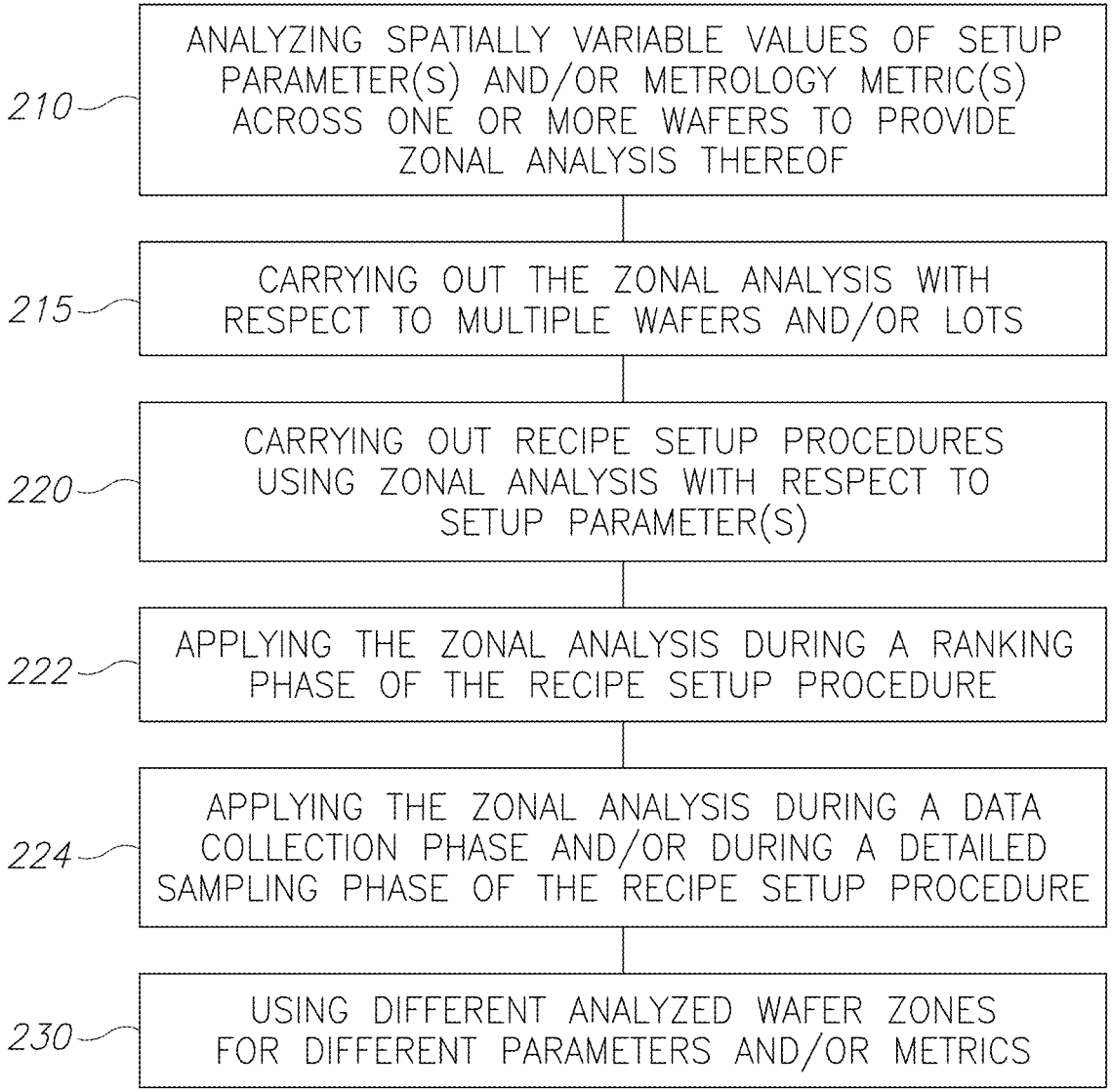
FIG. 7 is a high-level flowchart illustrating a method of zonal analysis, according to some embodiments of the invention.

FIG. 7 is a high-level flowchart illustrating method 200 of zonal analysis, according to some embodiments of the invention. The method stages may be carried out with respect to metrology module 90 and zonal analysis 200 described above, which may optionally be configured to implement method 200. Method 200 or stage(s) thereof may be carried out as part of method 100 disclosed above. Method 200 may be at least partially implemented by at least one computer processor, e.g., in a metrology module. Certain embodiments comprise computer program products comprising a computer readable storage medium having computer readable program embodied therewith and configured to carry out the relevant stages of method 200. Method 200 may comprise the following stages, irrespective of their order.

Method 200 may comprise analyzing, spatially, variable values of setup parameter(s) and/or metrology metric(s) across one or more wafers to provide zonal analysis thereof (stage 210) and optionally carrying out the zonal analysis with respect to multiple wafers and/or lots (stage 215).

Method 200 may further comprise carrying out one or more recipe setup procedure(s) using zonal analysis with respect to at least one setup parameter (stage 220), wherein the zonal analysis comprises spatially variable values of the at least one setup parameter across at least one wafer. The setup parameter(s) may comprise, e.g., sensitivity, accuracy indicators, target quality indicators, performance indicators (e.g., precision, TIS, matching, signal quality, etc.), process indicators (e.g., thickness variations, SWA, CD, etc.) and so forth.

Method 200 may comprise applying the zonal analysis during a ranking phase of the recipe setup procedure (stage 222) and/or during a data collection phase and/or during a detailed sampling phase of the recipe setup procedure (stage 224). In certain embodiments, method 200 may comprise using different analyzed wafer zones for different parameters and/or metrics (stage 230), e.g., the at least one setup parameter may comprise a plurality of setup parameters and the zonal analysis may comprise different wafer zones with respect to different parameters. In certain embodiments, method 200 may comprise carrying out metrology measurements using the zonal analysis with respect to at least one metrology metric (see stage 210). The at least one metrology metric may comprise a plurality of metrology metrics and the zonal analysis may comprise different wafer zones with respect to different metrics (see stage 230). The metrology metric(s) may comprise, e.g., overlay, residuals, tool performance parameters, and quality matrices.

In certain embodiments, the zonal analysis may be carried out with respect to concentric zones configured to distinguish at least a wafer center from wafer edges. In certain embodiments, the zonal analysis may be carried out in a spatially continuous manner. For example, the zonal analysis may be carried out with respect to tunable spectrum illumination (and the at least one setup parameter comprise an illumination wavelength). Correspondingly, method 200 may comprise carrying out the spatially continuous zonal analysis with respect spectrum parameters in tunable spectrum metrology applications Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method comprising:
   deriving landscape information from produced wafers, wherein the landscape information comprises wavelength spectra signatures over the wafers, wherein the landscape information is carried out with respect to a plurality of wafers, wafer lots and/or batches, and wherein the landscape information is carried out with respect to a plurality of chambers,
   identifying, in the derived landscape information, indications for production process changes, and
   modifying production process parameters with respect to the identified indications, to maintain the production process within specified requirements,
   wherein the landscape information comprises a visualization of a relation between at least one metrology metric and at least one recipe or measurement parameter with the wavelength spectra signatures at a field level and at a wafer level that track performance degradation with respect to a production tool of a plurality of production tools, wherein the production tool has one of the chambers, and
   wherein at least one of the deriving, the identifying and the modifying is carried out by at least one computer processor.

2. The method of claim 1, wherein the landscape information comprises at least one wafer map of landscapes which are spatially associated with the produced wafers.

3. The method of claim 1, further comprising performing root cause analysis for the identified production process changes with respect to the production tools and/or the chambers.

4. The method of claim 1, further comprising optimizing working point parameters, which comprise values of the recipe or measurement parameters, using zonal analysis relating to a spatial distribution of the landscape information across the wafers.

5. The method of claim 1, further comprising training a corresponding algorithm to perform the identifying, using training wafers to which the method is applied.

6. The method of claim 1, further comprising indicating tool aging and required maintenance, using the identified indications.

7. The method of claim 1, further comprising optimizing designs of devices and/or targets with respect to the derived landscape information.

8. A metrology module configured to carry out the method of claim 1.

9. A computer program product comprising a non-transitory computer readable storage medium having computer readable program embodied therewith, the computer readable program configured to carry out the method of claim 1.

10. The method of claim 1, wherein the identifying includes quantifying an amount of process change using machine learning.

11. The method of claim 1, wherein modifying the production process parameters is part of a control loop for the production process parameters.

12. The method of claim 1, wherein at least two of the chambers are in different production tools.

13. The method of claim 12, wherein each of the production tools is an imaging metrology tool, a scatterometry metrology tool, a scanning electron microscopy tool, or an electron beam tool.

* * * * *